US 10,995,771 B2

(12) United States Patent
Chen et al.

(10) Patent No.: US 10,995,771 B2
(45) Date of Patent: May 4, 2021

(54) ADJUSTABLE COOLING FAN APPARATUS

(71) Applicant: QUANTA COMPUTER INC., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 129 days.

(21) Appl. No.: 16/405,490

(22) Filed: May 7, 2019

(65) Prior Publication Data

US 2020/0271128 A1   Aug. 27, 2020

Related U.S. Application Data

(60) Provisional application No. 62/811,274, filed on Feb. 27, 2019.

(51) Int. Cl.
*F04D 29/56* (2006.01)
*G06F 1/20* (2006.01)
*H05K 7/20* (2006.01)

(52) U.S. Cl.
CPC ............ *F04D 29/563* (2013.01); *G06F 1/20* (2013.01); *H05K 7/20172* (2013.01); *G06F 2200/201* (2013.01)

(58) Field of Classification Search
CPC ...... F04D 29/563; F04D 25/14; F04D 25/166; G06F 1/20; G06F 2200/201; H05K 7/20172; H05K 7/20727; H05K 7/20181
USPC ....................................................... 415/148
See application file for complete search history.

(56) References Cited

U.S. PATENT DOCUMENTS

| 3,204,548 A | * | 9/1965 | McCabe | F24F 13/15 454/352 |
| 3,698,429 A | * | 10/1972 | Lowe | F16K 1/165 137/601.06 |
| 4,653,384 A | * | 3/1987 | Amano | F24F 13/15 454/319 |
| 6,011,689 A | | 1/2000 | Wrycraft | |
| 6,229,701 B1 | * | 5/2001 | Kung | G06F 1/203 165/185 |

(Continued)

FOREIGN PATENT DOCUMENTS

| CN | 205356933 U | 6/2016 |
| JP | 2011231954 A | 11/2011 |

(Continued)

OTHER PUBLICATIONS

Extended European Search Report for EP Application No. 19187774.5, dated Jan. 20, 2020.

(Continued)

*Primary Examiner* — J. Todd Newton
(74) *Attorney, Agent, or Firm* — Nixon Peabody LLP

(57) ABSTRACT

The present disclosure provides an apparatus for a cooling fan in a computer system. The apparatus comprises a plurality of bars, a plurality of slats, a knob, and at least one pin. Each slat of the plurality of slats pivotably couples to at least one bar in the plurality of bars. The knob is located at an option on each of bar of a plurality of bars. Rotating movements of the knob adjust the apparatus between a plurality of positions. The at least one pin can be received at an opening in the cooling fan.

20 Claims, 4 Drawing Sheets

(56) References Cited

U.S. PATENT DOCUMENTS

| | | | |
|---|---|---|---|
| 7,866,737 B2 * | 1/2011 | Browne | F24F 13/1426 |
| | | | 296/193.1 |
| 8,408,981 B2 * | 4/2013 | Su | F04D 27/002 |
| | | | 454/358 |
| 9,261,926 B2 * | 2/2016 | Larsen | G06F 1/20 |
| 10,582,638 B2 * | 3/2020 | Ye | F24F 13/15 |
| 2006/0152901 A1 | 7/2006 | Espinoza-Ibarra et al. | |
| 2011/0175007 A1 * | 7/2011 | Sato | H05K 7/20172 |
| | | | 251/301 |
| 2011/0228477 A1 * | 9/2011 | Hong | H05K 7/20181 |
| | | | 361/695 |
| 2011/0259550 A1 | 10/2011 | Komaba et al. | |
| 2017/0081907 A1 | 3/2017 | Chen et al. | |
| 2020/0271128 A1 * | 8/2020 | Chen | H05K 7/20727 |

FOREIGN PATENT DOCUMENTS

| | | |
|---|---|---|
| JP | 2014007346 A | 1/2014 |
| TW | M376806 U1 | 3/2010 |
| TW | 201315358 A1 | 4/2013 |

OTHER PUBLICATIONS

TW Office Action for Application No. 108120936, dated Jan. 15, 2020, w/ First Office Action Summary.
TW Search Report for Application No. 108120936, dated Jan. 15, 2020, w/ First Office Action.
JP Office Action for Application No. 2019-158236, dated Oct. 6, 2020, w/ First Office Action Summary.

* cited by examiner

ADJUSTABLE COOLING FAN APPARATUS

CROSS REFERENCE TO RELATED APPLICATIONS

This application claims priority under 35 U.S.C. § 119 to U.S. Provisional Application No. 62/811,274, entitled, "Flexible Louver with Foolproof Device," and filed on Feb. 27, 2019. The contents of that application are hereby incorporated by reference in their entirety.

FIELD

The present disclosure relates to an adjustable apparatus for a computer fan.

BACKGROUND

Computer components produce heat, which in turn increases the ambient temperature in a computer system. Increased ambient temperature can damage computer components, and cause failure of the computer system. A cooling fan is typically used in a system to control the ambient temperature of the system, and to direct airflow. Conventional computer systems have an array of cooling fans, each fan pointing at different components. When properly operating, the cooling fans can provide balanced airflow over a chassis body. However, if one cooling fan fails, the air intake of the remaining cooling fans can draw air backwards through the failed fan. This disrupts the airflow through the computer chassis because some of the airflow is now reversed. This inverse airflow prevents the remaining cooling fans from properly cooling the chassis. As a result, heat is increased in the chassis body, which can eventually cause damage to the computer components. Therefore, systems are needed to ensure proper airflow through a computer system even when a fan fails.

SUMMARY

The various examples of the present disclosure are directed to an apparatus for a computer system. In a first embodiment, the apparatus includes a plurality of bars, a plurality of slats, a knob, and at least one pin. Each slat in the plurality of slats is pivotably coupled to a bar in the plurality of bars. A first pair of bars in the plurality of bars has an option on each bar. The knob is received at this option so that rotating movements of the knob cause the apparatus to adjust between a plurality of positions. A pin is coupled to one of the plurality of bars. The pin secures the apparatus to a cooling fan in a cooling system.

In some examples, the apparatus has multiple pins corresponding to multiple cooling fans in the computer system. Each pin includes a male connector configured to be received at an indented portion of the cooling fan. For example, the indented portion can be an option or an opening.

In some examples, a position of the pin in the cooling fan locks the apparatus in one position of the plurality of positions. For example, the apparatus can be locked in (1) a first position to allow airflow intake but not airflow exhaust, or (2) a second position to allow airflow exhaust but not airflow intake.

In some examples, the first pair of bars is located at a top portion of the apparatus, and a second pair of bars is located at a bottom portion of the apparatus. Each bar can have a plurality of indented portions. Each indented portion corresponds to a slat in the plurality of slats.

In some examples, when the apparatus is locked in the first position, the plurality of indented portions configures the plurality of slats to pivot in a first direction (allowing air intake) and not in a second direction (preventing air exhaust). When in the first position, the slats can pivot in the first direction upon receiving airflow in the first direction. When either no airflow is received from the first direction or when airflow is received from the second direction, the slats lie adjacent to neighboring slats in the plurality of slats. Therefore, airflow from the second direction is prevented from entering the apparatus. The first direction is opposite the second direction.

When the apparatus is locked in the second position, the plurality of indented portions configures the plurality of slats to pivot in the second direction (allowing air exhaust) and not the first direction (preventing air intake). The slats pivot in the second direction upon receiving airflow in the second direction. When either no airflow is received from the second direction or when airflow is received from the first direction, the slats lie adjacent to neighboring slats in the plurality of slats. Therefore, airflow from the first direction is prevented from entering the apparatus.

A second embodiment of the present disclosure provides for a fan assembly for a computer chassis. The fan assembly includes a plurality of fans, a frame, and an apparatus configured to be received by the frame. The plurality of fans can be configured to be received in the computer chassis. The frame can correspond to the plurality of fans, and can receive the apparatus. The apparatus can be as provided for with respect to the first embodiment. Additional examples of the second embodiment can be as provided for with respect to the first embodiment.

A third embodiment of the present disclosure provides a fan assembly for a computer system. The fan assembly includes a fan, a frame corresponding to the fan, and an apparatus. The apparatus can be received by the frame. The apparatus and additional examples of the third embodiment can be provided for as in the first embodiment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1A:
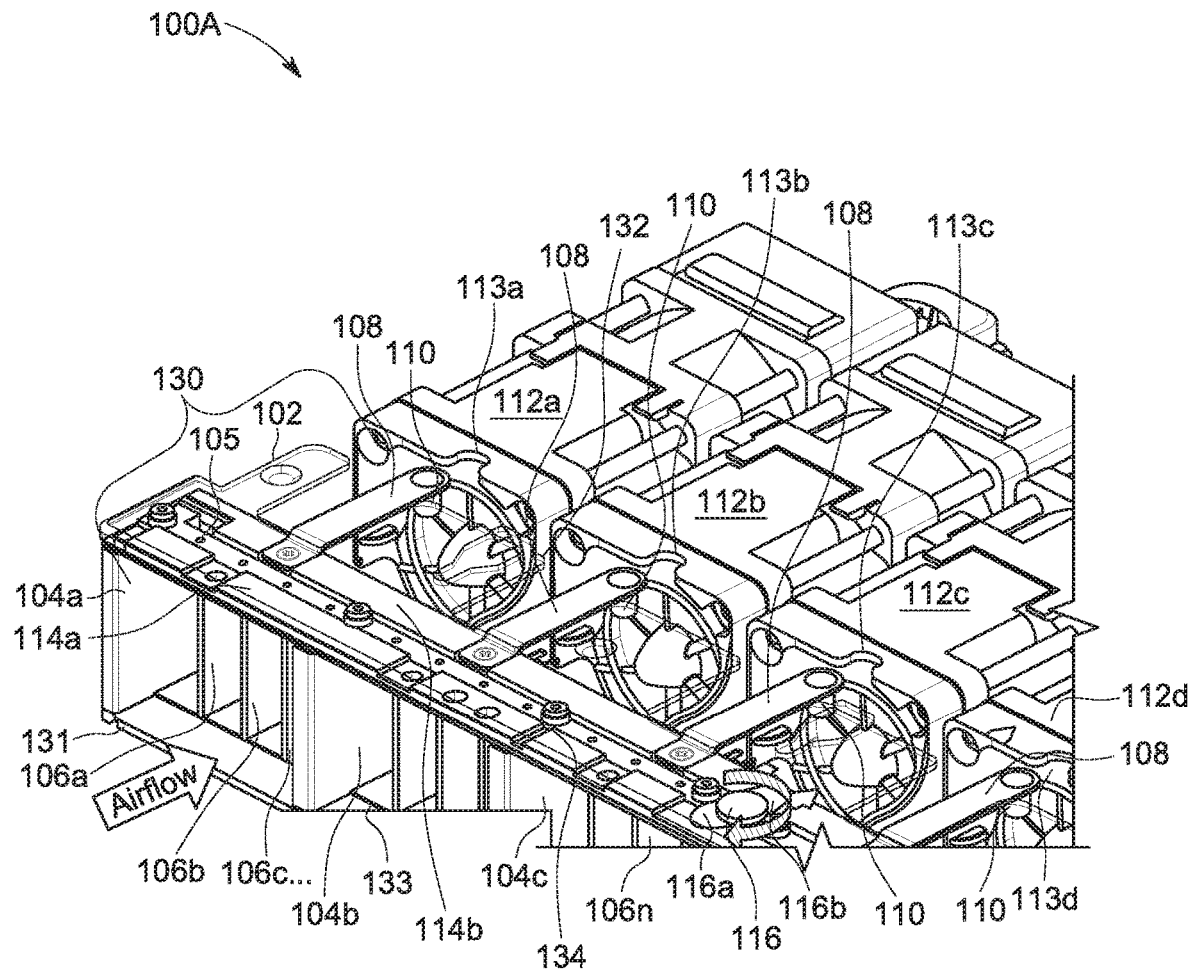
FIG. 1A shows an exemplary apparatus for controlling intake airflow, according to an embodiment of the present disclosure.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides an apparatus for a computer system. The apparatus comprises a plurality of bars, a plurality of slats, a knob, and at least one pin. The at least one pin can be received at an opening in a cooling fan so that the apparatus is housed adjacent to the cooling fan. In some examples, multiple pins are received at multiple cooling fans in a computer system. Each slat of the plurality of slats pivotably couples to at least one bar in the plurality of bars. The slats correspond to the cooling fans, and direct airflow towards the cooling fans. The knob is located at an option on each bar of a pair of bars. Rotating movements of the knob adjust the apparatus between a plurality of positions. The knob can adjust the apparatus such that the slats prevent air flowing through the cooling fans in an inverse direction.

Therefore, the disclosed apparatus automatically restricts air flowing in an inverse direction through a failed cooling fan. As such, the computing components in a computer system are efficiently and effectively cooled, thereby preventing overheating and malfunction of the computing components.

Figure 1B:
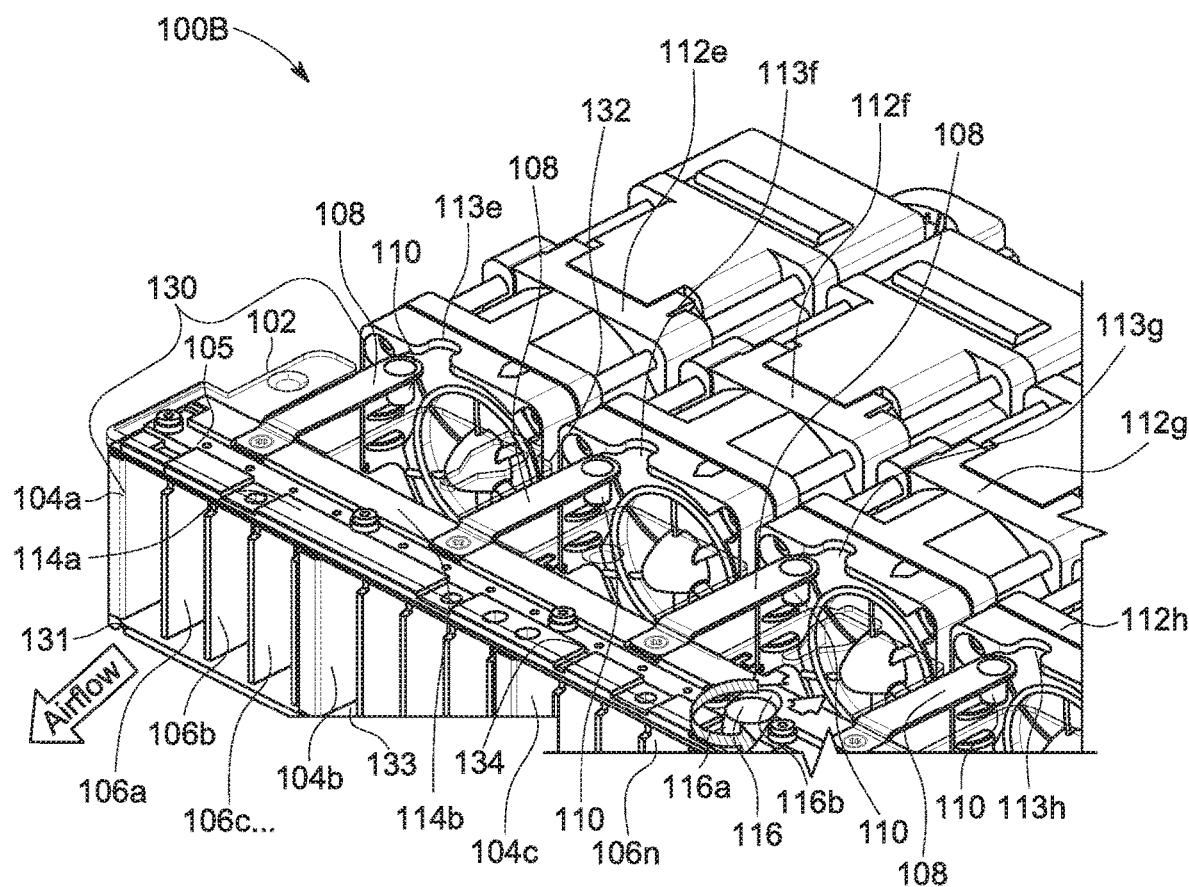
FIG. 1B shows an exemplary apparatus for controlling exhaust airflow, according to an embodiment of the present disclosure.

FIG. 1A shows a system 100A, according to an embodiment of the present disclosure. System 100A includes a frame 102; separators 104a, 104b, 104c; slats 106a, 106b, 106c . . . 106n; pins 108; male connectors 110; cooling fans 112a, 112b, 112c, and 112d; cooling fan opening 113a, 113b, 113c, and 113d; bars 114a and 114b; a knob 116; and an apparatus 130 FIG. 1B shows a system 100B, which includes similar components and labels to system 100A of FIG. 1A. System 100B of FIG. 1B additionally includes cooling fans 112e, 112f, 112g, and 112h; and openings 113e, 113f, 113g, and 113h. FIGS. 1A-1B show similar features of an apparatus for a computer fan, and the features will be discussed in tandem below. In some examples, systems 100A and 100B can be fan assemblies for a computer chassis or a computer system, as readily contemplated by one skilled in the art.

An apparatus 130 is configured to be received by a plurality of cooling fans (for example, cooling fans 112a, 112b, 112c, and 112d of FIG. 1A or cooling fans 112e, 112f, 112g, and 112h of FIG. 1B). Although apparatus 130 is shown to correspond to four cooling fans 112, apparatus 130 can be sized shorter or longer to correspond to any number of cooling fans. In some examples, apparatus 130 can correspond to a single cooling fan. Apparatus 130 and any corresponding cooling fans 112a, 112b, 112c, and 112d can be received in a computer chassis (not pictured).

Apparatus 130 includes a plurality of slats 106a, 106b, 106c . . . 106n and separators 104a, 104b, 104c. Each separator 104a, 104b, 104c can correspond to a division between two cooling fans (for example, separator 104a corresponds to a division between cooling fan 112a and 112b). The separators 104a, 104c, and 104d can be connected together via a separator housing 105. The separators 104a, 104c, and 104d additionally form barriers between sets of slats in the plurality of slats 106a, 106b, 106c . . . 106n.

A set of slats in the plurality of slats 106a, 106b, 106c . . . 106n can correspond to one cooling fan 112a, 112b, 112c, or 112d. For example, slats 106a, 106b, and 106c correspond to cooling fan 112a. Although three slats 106a, 106b, and 106c are shown corresponding to each cooling fan 112a, 112b, 112c, and 112d in FIG. 1A, any number of slats can correspond to each cooling fan, as long as there is at least one slat for each fan.

The slats 106a, 106b, 106c . . . 106n can be coupled to the apparatus 130 via bars 114a and 114b, which are at a top portion 134 of the apparatus 130. The bars 114a and 114b can have corresponding bars along a bottom portion 133 of the apparatus 130 (not pictured). In some examples, the bottom portion 133 can be the separator housing 105 without any bars. Each bar 114a and 114b can have an option (shown further in FIG. 2) to receive a knob 116. The knob 116 can have an end portion 116a corresponding to the end portion 114a, and an end portion 116b corresponding to the bar 114b. The knob 116 can rotate clockwise or counterclockwise. Clockwise movement is shown in FIG. 1A, and counter-clockwise movement is shown in FIG. 1B. Additional movement of the bars 114a and 114b and the knob 116 is discussed further below with respect to FIGS. 2 and 3A-3D.

Apparatus 130 can include a pin 108 for each cooling fan (for example, cooling fans 112a, 112b, 112c, and 112d in system 100A or cooling fans 112e, 112f, 112g, and 112h in system 100B). Each pin 108 is coupled to the bar 114b along a top portion of the apparatus 130. In some examples, the pins 108 can be connected to the separator housing 105 or the frame 102. Referring, for example, to FIG. 1A, each pin 108 includes a male connector 110 at an edge of the pin 108 to be received at a cooling fan 112a, 112b, 112c, or 112d. The male connector 110 can slide into an opening 113a of a corresponding cooling fan 112a. A location of opening 113a, 113b, 113c, and 113d in a cooling fan 112a, 112b, 112c, and 112d can correspond to a type of the cooling fan. For example, as shown in FIG. 1A, each cooling fan 112a, 112b, 112c, and 112d has an opening 113a, 113b, 113c, and 113d at a right side of the cooling fan. In FIG. 1B, each cooling fan 112e, 112f, 112g, and 112h has an opening 113e, 113f, 113g, and 113h at a left side of the cooling fan. The cooling fans 112a, 112b, 112c, and 112d of FIG. 1A correspond to air intake fans, where air flows from an exterior side 131 of the apparatus 130 towards an interior side 132. The cooling fans 112e, 112f, 112g, and 112h of FIG. 1B correspond to air exhaust fans where air flows from an interior side 132 of the apparatus 130 towards an exterior side 131.

Figure 2:
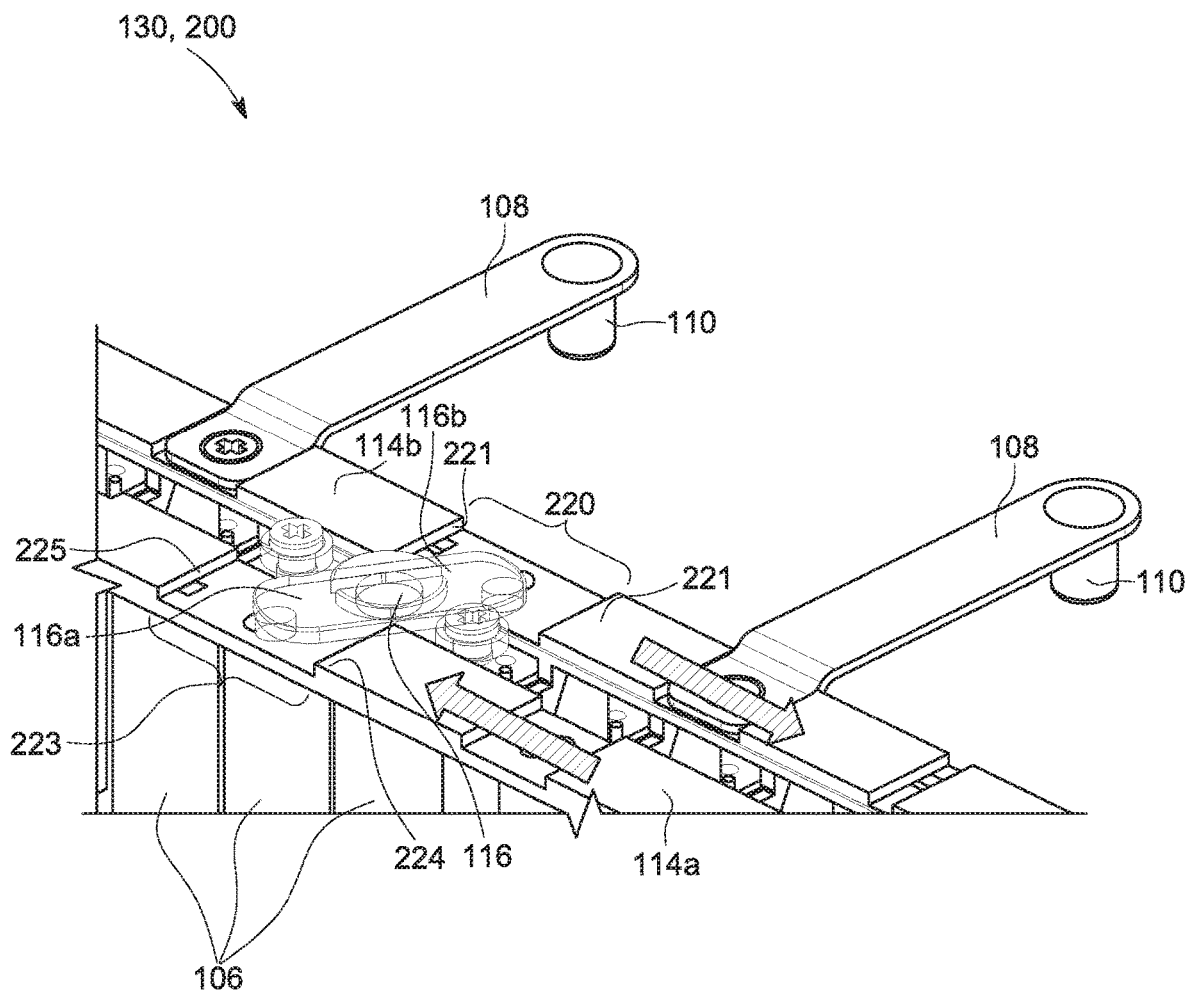
FIG. 2 shows a close-up view of a portion of an exemplary apparatus, according to an embodiment of the present disclosure.

FIG. 2 shows an exemplary view 200 of a portion of the apparatus 130. FIG. 2 has similar elements and labels as FIGS. 1A-1B, and additionally includes an option 220 on the bar 114a and an option 223 on the bar 114b. FIG. 2 demonstrates that rotation of the knob 116 causes the bars 114a and 114b to slide right and left, corresponding to the rotation of the knob 116. For example, if knob 116 is rotated counter-clockwise, an end portion 116b of the knob 116 will push against an edge 221 of the option 220 while end portion 116a pushes against an edge 224 of the option 223. This, in turn, causes the bar 114b to move towards the left, and the bar 114a to move towards the right. Because the slats 106 are coupled to the bars 114a and 114b, movement of the bars 114a and 114b changes an orientation of the slats 106 (as discussed further below with respect to FIGS. 3A-3D).

Similar to the counter-clockwise movement of the knob, clockwise rotation of the knob 116 causes an end portion 116a to push against the edge 221 of the option 220, as end portion 116b pushes against an edge 225 of the option 223. This, in turn, causes the bar 114b to move towards the right and the bar 114a to move towards the left. This movement additionally changes the orientation of the slats 106.

Therefore, the knob 116 can configure the disclosed apparatus to adjust between a plurality of positions. In particular, the knob 116 can configure the apparatus in a first position, where the bar 114b is slid entirely to the right, and the bar 114a is slid entirely to the left. This position allows pins 108 to connect with openings 113a, 113b, 113c, and 113d of air intake fans 112a, 112b, 112c, and 112d (as shown in FIG. 1A).

The knob 116 can also configure the apparatus in a second position, where the bar 114b is slid entirely to the left and the bar 114a is slid entirely to the right. This position allows pins 108 to connect with openings 113e, 113f, 113g, and 113h of air exhaust fans 112e, 112f, 112g, and 112h (as shown in FIG. 1B).

Referring in tandem to FIGS. 1A, 1B and 2, the pins 108 ensure that the apparatus 130 is in the proper position according to the type of fan. Because openings 113 on each fan 112 are in different places for air intake fans 112a, 112b, 112c, and 112d (openings 113a, 113b, 113c, and 113d are on the right) than for air exhaust fans 112e, 112f, 112g, and 112h (openings 113e, 113f, 113g, and 113h are on the left), the apparatus 130 has to be appropriately positioned when received by the cooling fans 112. For example, even if a user tries to install apparatus 130 into air exhaust fans 112e, 112f, 112g, and 112h when apparatus 130 is in the first position, receiving the pins 108 at the openings 113 will automatically transition the apparatus 130 into the second position. Similarly, even if a user tries to install apparatus 130 into air intake fans 112a, 112b, 112c, and 112d when apparatus 130 is in the second position, receiving the pins 108 at the openings 113 will automatically transition the apparatus 130 into the first position.

Therefore, the pins 108 serve as a foolproof mechanism to ensure that the apparatus 130 is properly positioned. The pins 108 can lock the apparatus 130 in the proper position when the apparatus 130 is received at cooling fans. Additionally, the knob 116 can position the bars 114a and 114b (and, accordingly, the slats 106 as discussed below) in any interim position between a first position as shown in FIG. 1A and a second position as shown in FIG. 1B.

Referring now to FIGS. 3A-3D, the positioning of the bars 114a and 114b, and therefore of the slats 106, is essential to the operation of the apparatus 130. FIG. 3A-3D show the functionality of the slats 106 in response to a first position and second position of the knob 116. FIGS. 3A-3D include similar components and labels to systems 100A, 100B, and apparatus 130 of FIGS. 1A, 1B, and 2, respectively. In addition, FIGS. 3A-3D include a plurality of indented portions 340 and a plurality of indented portions 350.

Figures 3A, 3B:
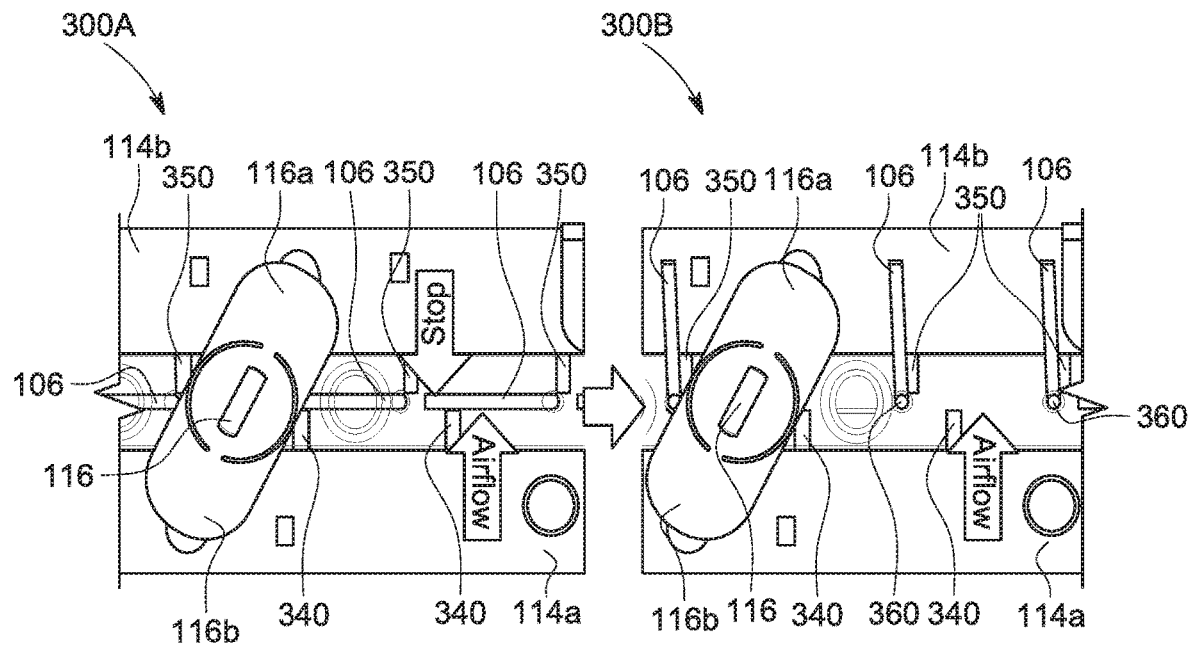
FIGS. 3A-3B show an exemplary apparatus configured for air intake, according to an embodiment of the present disclosure.

FIGS. 3A-3B show an exemplary apparatus 300A, 300B configured for air intake, according to an embodiment of the present disclosure. In some examples, when the bars 114a and 114b are locked in the first position (as shown in FIG. 1A), a plurality of indented portions 340 and 350 configures the plurality of slats 106 to pivot in a first direction towards the bar 114b (allowing air intake), and not a second direction towards the bar 114a (preventing air exhaust). For example, the slats 106 can be pivotably coupled at location 360 to the indented portions 340, 350, or to the separator housing 105 (not pictured). FIG. 3A shows a configuration of the apparatus 300A where the slats 106 are stopped from rotating towards the indented portions 340. FIG. 3B shows that slats 106 can rotate towards the indented portions 350.

Therefore, FIGS. 3A-3B show that when the knob 116 is rotated clockwise in the first position (or when pins 108 are received by air intake fans), the slats 106 pivot towards the indented portions 350 upon receiving airflow towards the indented portions 350. FIG. 3B shows that when either no airflow is received towards the indented portions 350 or when airflow is received towards the indented portions 340, the slats 106 lie adjacent to neighboring slats 106.

Figures 3C, 3D:
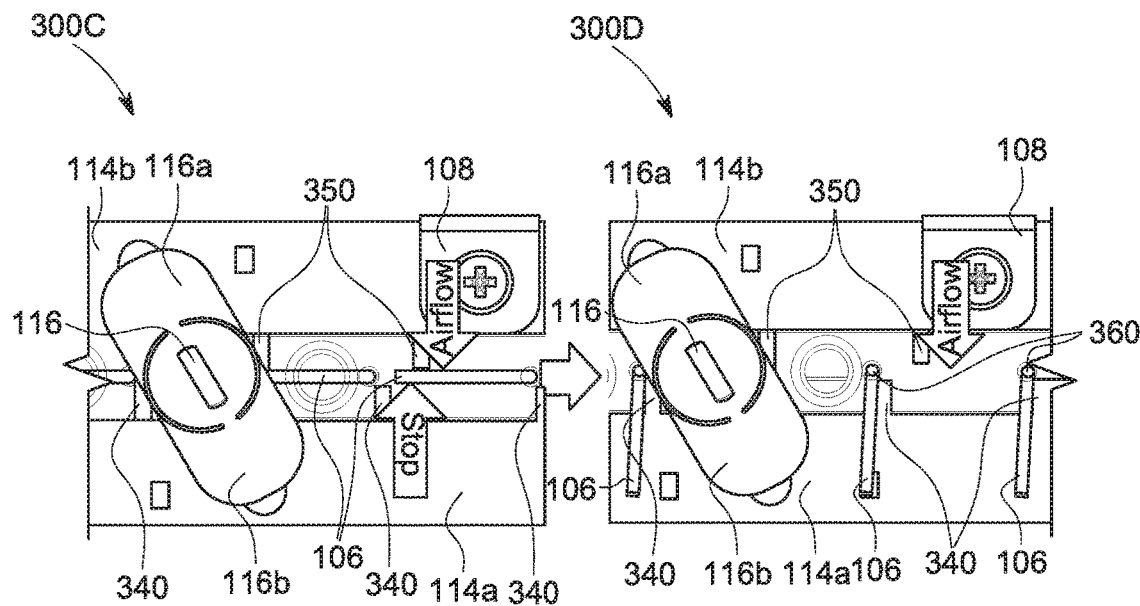
FIGS. 3C-3D shows an exemplary apparatus configured for air exhaust, according to an embodiment of the present disclosure.

FIGS. 3C-3D shows an exemplary apparatus 300C, 300D configured for air exhaust, according to an embodiment of the present disclosure. In some examples, when the bars 114a and 114b are locked in the second position (as shown in FIG. 1B), the plurality of indented portions 340 and 350 configures the plurality of slats 106 to pivot in a second direction towards the bar 114a (allowing air exhaust) and not a first direction towards the bar 114b (preventing air intake). FIG. 3C shows when the slats 106 are stopped from rotating towards the indented portions 350. FIG. 3D shows that slats 106 can rotate towards the indented portions 350.

Therefore, FIG. 3A shows that when the knob 116 is rotated counter-clockwise in the first position (or when pins 108 are received by air intake fans), the slats 106 pivot towards indented portions 340 upon receiving airflow towards the indented portions 340. FIG. 3B shows that when either no airflow is received towards the indented portions 340 or when airflow is received towards indented portions 350, the slats 106 lie adjacent to neighboring slats 106.

Therefore, FIGS. 3A-3D demonstrate that the slats 106 can be configured to move in one direction at a time (either towards the bar 114a or towards the bar 114b) according to a position of the knob 116. The slats 106 can be made of a lightweight material, for example, sheet metal, paper, or plastic. Referring back to FIGS. 1A-1B, the slats 106 can therefore prevent air from being drawn into systems 100A or 100B when a fan has failed (e.g. the cooling fans 112a, 112b, 112c, 112d, 112e, 112f, 112g, and 112h). The slats 106 automatically close so that remaining operational fans do not draw a backflow through the failed fan. The disclosed apparatus consequently ensures continuous airflow and cooling by the cooling fans.

While various examples of the present invention have been described above, it should be understood that they have been presented by way of example only, and not limitation.

Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An apparatus for a system, comprising:
   a plurality of bars;
   a plurality of slats, each slat of the plurality of slats pivotably coupled to at least one bar in the plurality of bars;
   a knob received at an option on each bar of a first pair of bars in the plurality of bars, wherein rotating movements of the knob cause the apparatus to adjust between a plurality of positions; and
   at least one pin coupled to one of the plurality of bars.

2. The apparatus of claim 1, wherein each pin of the at least one pin corresponds to a cooling fan in the system, and comprises a male connector configured to be received at an opening of the cooling fan.

3. The apparatus of claim 2, wherein a position of the at least one pin at the cooling fan locks the apparatus in one position of the plurality of positions.

4. The apparatus of claim 1, wherein the first pair of bars is located at a top portion of the apparatus, and a second pair of bars is located at a bottom portion of the apparatus.

5. The apparatus of claim 3, wherein each bar in the plurality of bars comprises a plurality of indented portions corresponding to slats in the plurality of slats.

6. The apparatus of claim 5, wherein the plurality of positions further comprises:
   a first position, wherein the plurality of indented portions allows the plurality of slats to pivot in a first direction, but not a second direction being opposite to the first direction; and
   a second position, wherein the plurality of indented portions allows the plurality of slats to pivot in the second direction, but not the first direction.

7. The apparatus of claim 6, wherein each slat in the plurality of slats is configured to:
   pivot in the first direction upon receiving airflow in the first direction; and
   lie adjacent to neighboring slats in the plurality of slats when no airflow is received in the first direction.

8. The apparatus of claim 6, wherein each slat in the plurality of slats is further configured to:
   pivot in the second direction upon receiving airflow in the second direction; and
   lie adjacent to neighboring slats in the plurality of slats when no airflow is received in the second direction.

9. A fan assembly for a computer chassis, comprising:
   a plurality of fans configured to be received in the computer chassis;
   a frame corresponding to the plurality of fans; and
   an apparatus configured to be received by the frame, comprising:
      a plurality of bars;
      a plurality of slats corresponding to the plurality of fans, each slat of the plurality of slats pivotably coupled to at least one bar in the plurality of bars;
      a knob received at an option on each bar of a first pair of bars in the plurality of bars, wherein rotating movements of the knob cause the apparatus to adjust between a plurality of positions; and
      at least one pin coupled to one of the plurality of bars.

10. The fan assembly of claim 9, wherein each pin of the at least one pin corresponds to a fan in the plurality of fans and comprises a male connector configured to be received at an option of the fan.

11. The fan assembly of claim 10, wherein a position of the at least one pin at the fan locks the apparatus in one position of the plurality of positions.

12. The fan assembly of claim 9, wherein each bar in the plurality of bars comprises a plurality of indented portions corresponding to slats in the plurality of slats.

13. The fan assembly of claim 12, wherein the plurality of positions further comprises:
   a first position, wherein the plurality of indented portions allows the plurality of slats to pivot in a first direction, but not a second direction being opposite to the first direction; and
   a second position wherein the plurality of indented portions allows the plurality of slats to pivot in the second direction, but not the first direction.

14. The fan assembly of claim 13, wherein each slat in the plurality of slats is configured to:
   pivot in the first direction upon receiving airflow in the first direction; and
   lie adjacent to neighboring slats in the plurality of slats when no airflow is received in the first direction.

15. The fan assembly of claim 14, wherein each slat in the plurality of slats is configured to:
   pivot in the second direction upon receiving airflow in the second direction; and
   lie adjacent to neighboring slats in the plurality of slats when no airflow is received in the second direction.

16. A fan assembly for a computer system, comprising:
   a fan;
   a frame corresponding to the fan; and
   an apparatus configured to be received by the frame, comprising:
      a plurality of bars;

a plurality of slats corresponding to the fan, each slat of the plurality of slats pivotably coupled to at least one bar in the plurality of bars;

a knob received at an option on each bar of the first pair of bars, wherein rotating movements of the knob cause the apparatus to adjust between a plurality of positions; and a pin coupled to one of the plurality of bars.

17. The fan assembly of claim 16, wherein each pin of the at least one pin corresponds to a cooling fan in the computer system, and comprises a male connector configured to be received at an opening of the cooling fan.

18. The fan assembly of claim 16, wherein each bar in the plurality of bars comprises a plurality of indented portions corresponding to slats in the plurality of slats.

19. The fan assembly of claim 18, wherein the plurality of positions further comprises:

a first position, wherein the plurality of indented portions allows the plurality of slats to pivot in a first direction, but not a second direction being opposite to the first direction; and a second position wherein the plurality of indented portions allows the plurality of slots to pivot in the second direction, but not the first direction.

20. The fan assembly of claim 19, further comprising:

wherein the first position configures each slat in the plurality of slats to:

pivot in the first direction upon receiving airflow in the first direction; and lie adjacent to neighboring slats in the plurality of slats when no airflow is received in the first direction; and wherein the second position configures each slat in the plurality of slats to:

pivot in the second direction upon receiving airflow in the second direction; and lie adjacent to neighboring slats in the plurality of slats when no airflow is received in the second direction.

\* \* \* \* \*